(12) United States Patent
Peelman et al.

(10) Patent No.: US 8,756,880 B2
(45) Date of Patent: Jun. 24, 2014

(54) PHOTOVOLTAIC MODULE ASSEMBLY

(75) Inventors: Jeffery Peelman, Tiffin, OH (US);
Nazoor Baig, Brownstown, MI (US);
Brian Tell, Ypsilanti, MI (US)

(73) Assignee: ShadePlex, LLC, Toledo, OH (US)

( * ) Notice: Subject to any disclaimer, the term of this patent is extended or adjusted under 35 U.S.C. 154(b) by 90 days.

(21) Appl. No.: 13/311,113

(22) Filed: Dec. 5, 2011

(65) Prior Publication Data

US 2012/0137601 A1     Jun. 7, 2012

Related U.S. Application Data

(60) Provisional application No. 61/419,402, filed on Dec. 3, 2010.

(51) Int. Cl.
*E04D 13/18* (2014.01)

(52) U.S. Cl.
USPC ........................................ 52/173.3; 52/173.1

(58) Field of Classification Search
CPC ........................... H01L 31/048; H01L 31/0422
USPC .............................................. 52/173.1, 173.3
See application file for complete search history.

(56) References Cited

U.S. PATENT DOCUMENTS

| | | | | |
|---|---|---|---|---|
| 3,004,592 A | * | 10/1961 | Norton | 160/114 |
| 4,537,838 A | * | 8/1985 | Jetter et al. | 429/9 |
| 4,574,160 A | * | 3/1986 | Cull et al. | 136/245 |
| 4,713,492 A | * | 12/1987 | Hanak | 136/245 |
| 4,860,509 A | * | 8/1989 | Laaly et al. | 52/173.3 |
| 4,884,360 A | * | 12/1989 | Pearcy | 43/54.1 |
| 5,267,643 A | * | 12/1993 | Scribner | 383/17 |
| 5,582,197 A | * | 12/1996 | Dobberstein | 135/87 |
| 5,707,459 A | * | 1/1998 | Itoyama et al. | 136/251 |
| 6,295,818 B1 | * | 10/2001 | Ansley et al. | 60/641.8 |
| 6,313,438 B1 | * | 11/2001 | Emerick, Jr. | 219/212 |
| 6,491,051 B2 | * | 12/2002 | Pierce et al. | 135/87 |
| 6,730,841 B2 | * | 5/2004 | Heckeroth | 136/251 |
| 2006/0023446 A1 | * | 2/2006 | Racoosin | 362/227 |
| 2006/0028166 A1 | * | 2/2006 | Closset et al. | 320/101 |
| 2007/0006907 A1 | * | 1/2007 | Yueh | 135/91 |
| 2010/0180922 A1 | * | 7/2010 | McKenna | 135/96 |
| 2012/0137600 A1 | * | 6/2012 | Jenkins | 52/173.3 |

* cited by examiner

*Primary Examiner* — Elizabeth A Plummer
(74) *Attorney, Agent, or Firm* — Fraser Clemens Martin & Miller LLC; Jacob M. Ward

(57) ABSTRACT

A photovoltaic module assembly includes a photovoltaic module and a base layer. The photovoltaic module has a bottom side, a top side, a main body, and a peripheral edge strip. The peripheral edge strip includes a plurality of apertures formed therethrough. The base layer is disposed adjacent the bottom side of the photovoltaic module. The base layer has an underlying portion and a flap portion. The flap portion is folded over the peripheral edge strip of the photovoltaic module, and is disposed adjacent the top side of the photovoltaic module. The flap portion is attached to the underlying portion of the base layer through the plurality of apertures in the peripheral edge strip. The photovoltaic module is thereby secured to the base layer.

19 Claims, 3 Drawing Sheets

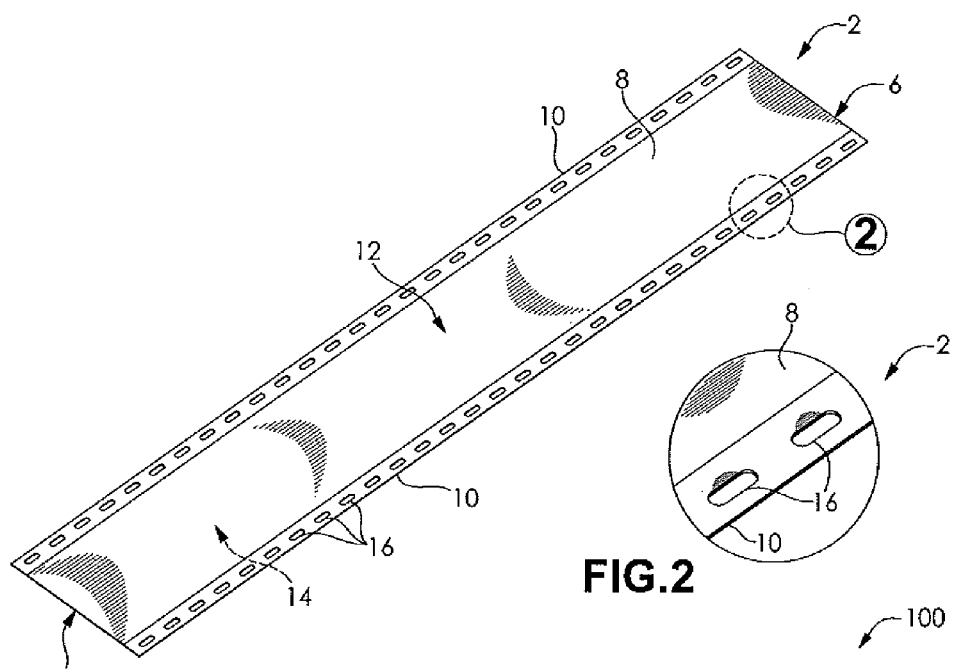
FIG.1
FIG.2
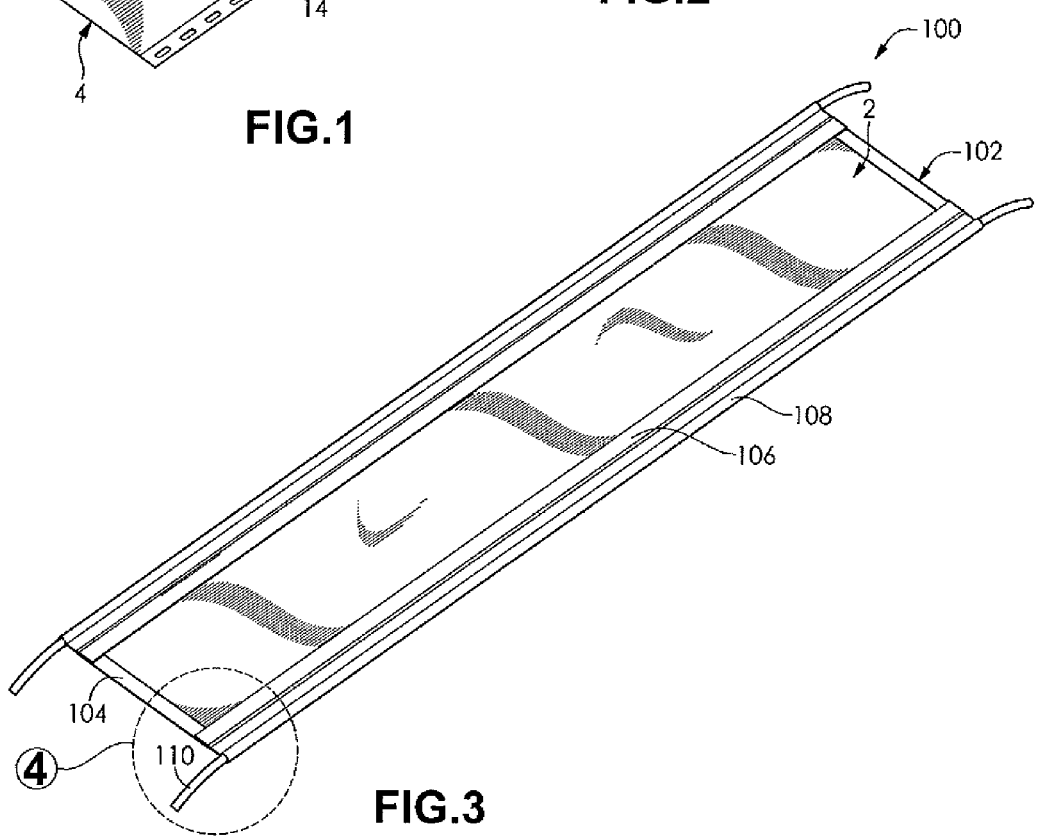
FIG.3

PHOTOVOLTAIC MODULE ASSEMBLY

CROSS-REFERENCE TO RELATED APPLICATIONS

This application claims the benefit of U.S. Provisional Application No. 61/419,402, filed on Dec. 3, 2010. The entire disclosure of the above application is hereby incorporated herein by reference.

FIELD OF THE INVENTION

This invention relates to a photovoltaic module assembly and, more particularly, to a photovoltaic module assembly for use in structural or architectural materials.

BACKGROUND OF THE INVENTION

Solar or photovoltaic cells are electronic devices that convert solar energy into electricity by the photovoltaic effect. Individual photovoltaic cells are often electrically connected and encapsulated as photovoltaic modules, which have many applications. Photovoltaic modules generate a form of renewable electricity, and are therefore particularly useful in situations where electrical power from a grid is unavailable. Photovoltaic electricity is also increasingly deployed in grid-tied electrical systems.

Recent improvements to photovoltaic modules have resulted from the advent of thin film technologies. In particular, flexible amorphous photovoltaic modules eliminate the previous constraints of rigid substrates, and make possible the development of many new applications, including incorporation of photovoltaic modules into flexible support structures. Known laminated thin film photovoltaic systems are described in Assignee's co-pending U.S. patent application Ser. No. 12/340,542, the entire disclosure of which is hereby incorporated herein by reference.

There is a continuing need for a method of incorporating photovoltaic modules into various flexible support structures such as tents and canopies. Desirably, the method provides an assembly including photovoltaic modules attached to flexible structural or architectural materials in a durable and weather-resistant manner.

SUMMARY OF THE INVENTION

In concordance with the instant disclosure, a method of incorporating photovoltaic modules into various flexible support structures such as tents and canopies, which provides an assembly including photovoltaic modules attached to flexible structural or architectural materials in a durable and weather-resistant manner, has surprisingly been discovered.

The present disclosure includes a method for mounting or attaching flexible thin film photovoltaic modules onto structural or architectural fabrics. The method creates a fabric-framed/fabric-mounted photovoltaic panel for use on other fabrics, on various permanent and non-permanent buildings and structures such as canopies, awnings, tents, portable shelters, vehicle shade structures and carports, tension frame and clearspan buildings, and on flat, domed or low-slope roofs.

In an illustrative embodiment, a method for mounting or attaching flexible thin film photovoltaic modules onto structural or architectural fabrics, to create a fabric-framed/fabric-mounted photovoltaic panel for use on other fabrics and on various buildings and structures, may include the steps of:
   providing at least one strip of continuous fabric, either coated or non-coated, and a flexible, thin-film photovoltaic module having a non-functional, perimeter edge with a top side and a bottom side;
   engineering a series of multiple holes or "windows" to be placed in the non-functional, perimeter edge of the photovoltaic module in such a size, shape, number, and configuration as to enable precise portions of a folded, hemmed fabric flap to be secured, by means of hot-air or sonic/radio frequency welds, to precise portions of an underlying fabric frame, cradle, pocket or channel;
   preparing the photovoltaic module for the engineered windows around the perimeter of the non-functional area;
   folding the fabric over onto itself to form a hemmed flap that is secured by mechanical means such as through specialized hot air or sonic/radio frequency welding apparatus to form a pocket or channel for placement of a cable or cord;
   placing the folded, hemmed fabric flap in such a manner wherein the edges of the fabric align on the top-side of the non-functional, perimeter edge of the flexible, thin-film photovoltaic module such that the a fabric cradle is formed to surround the entire length and width of the flexible photovoltaic module;
   securing the fabric cradle, frame, pocket or channel, and the non-functional, perimeter edge of the flexible, thin-film photovoltaic module through mechanical means such as specialized hot air or sonic/radio frequency welding apparatus and in such a way that precise portions of the folded, hemmed fabric flap are attached to precise portions of the underlying fabric frame, cradle, pocket or channel; and
   folding any remaining fabric upon any areas of the non-functional perimeter of the photovoltaic modules where window holes have not been placed to form a hem, and securing the hemmed fabric to the non-functional perimeter through mechanical means such as specialized hot air or sonic/radio frequency welding apparatus or a sealant to form a finished, sealed fabric cradle.

Strips of continuous fabric, either coated or non-coated, in which the fabric is folded over on itself to form a cradle, frame, pocket or channel, and in which the fabric cradle surrounds the entire length and width of the flexible photovoltaic module and the folded, hemmed flap of the fabric, is placed on the top-most side of the non-functional, perimeter edge of a flexible, thin-film photovoltaic module in a hemmed fashion. The fabric is secured to the photovoltaic module by mechanical means, such as heat welding or sonic welding. A length of the perimeter edge of the photovoltaic module to be overlaid will vary depending on the forces and loading for which the fabric cradle is to be subjected.

The means for securing the folded hemmed flap of the fabric cradle, frame, pocket or channel onto the perimeter of the flexible, thin-film photovoltaic module may be a mechanical attachment consisting of a series of multiple holes or "windows". The windows are engineered and placed in the non-functional, perimeter edge of the photovoltaic module in such a size, shape, number, and configuration as to enable precise portions of the folded hemmed fabric flap to be secured, by means of hot-air or sonic/radio frequency welds, to precise portions of the underlying fabric frame, cradle, pocket or channel. The fabric-to-fabric weld within each window will be dependent on the type of fabric and photovoltaic encapsulant materials utilized.

The means of securing the top edge-strip onto the perimeter of the flexible, thin-film photovoltaic module can include alternative or additional mechanical reinforcement of the welded bond through sewing, clamping or a piercing or non-piercing fastener.

Any remaining portions of the folded, hemmed fabric flap that are to be secured to areas of the non-functional perimeter of the photovoltaic modules where window holes have not been placed, may be secured through mechanical means such as specialized hot air or sonic/radio frequency welding apparatus or a sealant to form a finished, sealed fabric frame.

The folded, hemmed flap that is formed when the fabric is folded over to create a cradle, frame, pocket or channel, can include a solid core rod, cable or cord of various materials, including, but not limited to, steel aircraft cables, PVC extruded cords, wooden dowels, or ropes, that are secured by mechanical means such as specialized hot air or sonic/radio frequency welding apparatus, and which can be used in the attachment of the fabric-framed flexible photovoltaic panel to various buildings or structures by means of sections of extruded rails, frames, or other structural or building components.

The top edge-strip of the folded, hemmed flap, i.e., the portion that is attached to the non-functional perimeter of the flexible photovoltaic module, is supported by a non-load bearing sealant material between the outer portion of the edge-strip that overlays the peripheral edge strip of the photovoltaic module but is not welded to the perimeter, in order to prevent moisture from passing beneath the fabric strip. The sealant material should preferably be of a type that has a high resistance to moisture and ultraviolet radiation. Exemplary sealant techniques that can be used according to the present disclosure include, but will not be limited to, the use of a broad range of hot melt adhesive formulations that are known to be used in conjunction with fabrics, the use of industrial based adhesive tape materials, flexible cynoacrylates, and the use of other fabric membrane materials.

The fabric-framed flexible thin film photovoltaic systems of the present disclosure can be incorporated into or used as various architectural structural elements such as, but not limited to, frames, clearspans, inflatable tension structures, outdoor shade structures, shades, awnings, canopies, banners, billboards and other signage, tents, tarps, swimming pool covers, sails, flat roofs, flat roof membranes, and other types of structures that are made from fabrics, including wing and stabilizer surfaces of ultra light and other aircraft. In addition, the fabric-framed flexible thin film photovoltaic systems of the present disclosure can be incorporated into curtains, draperies, window shades, umbrellas, backpacks, and articles of clothing. These are non-limiting examples of uses to which the laminated thin film photovoltaic systems of the present disclosure can be put.

The fabric cradles, frames, pockets or channels for the fabric-framed flexible thin film photovoltaic systems of the present disclosure can be any type of woven or non-woven, coated or non-coated fabric as well as sheets or films of materials such as plastics, elastomers, rubbers, etc. which are sufficiently sturdy or thick to support the fabric-framed flexible thin film photovoltaic systems of the present disclosure. As noted herein, reference herein to fabric should not be interpreted as excluding sheets or films of materials such as plastics, elastomers, rubbers, etc.

The flexible photovoltaic modules for the fabric-framed flexible thin film photovoltaic systems of the present disclosure can be of any type of amorphous silicon (a-Si), crystalline silicon, copper indium gallium selenide (CIGS), cadmium telluride (CdTe), organic polymer, or other type of active photovoltaic material that has a non-functioning perimeter suitable for the methods claimed in the present disclosure.

The flexible thin film photovoltaic module attachment methods of the present disclosure can comprise part of an architectural structure.

In one embodiment, a photovoltaic module assembly includes a photovoltaic module and a base layer. The photovoltaic module has a bottom side, a top side, a main body, and a peripheral edge strip. The peripheral edge strip includes a plurality of apertures formed therethrough. The base layer is disposed adjacent the bottom side of the photovoltaic module. The base layer has an underlying portion and a flap portion. The flap portion is folded over the peripheral edge strip of the photovoltaic module, and is disposed adjacent the top side of the photovoltaic module. The flap portion is attached to the underlying portion of the base layer through the plurality of apertures in the peripheral edge strip. The photovoltaic module is thereby secured to the base layer.

In another embodiment, an architectural structure includes the photovoltaic module assembly.

In a further embodiment, a method for manufacturing the photovoltaic module assembly includes the steps of: disposing the base layer adjacent the bottom side of the photovoltaic module; folding the flap portion over the peripheral edge strip of the photovoltaic module; and attaching the flap portion to the underlying portion of the base layer through the plurality of apertures in the peripheral edge strip of the photovoltaic module. The photovoltaic module is thereby secured to the base layer to form the photovoltaic module assembly.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which:

FIG. 1 is a top perspective view of a photovoltaic module according to one embodiment of the present disclosure;

FIG. 2 is an enlarged fragmentary top perspective view of the photovoltaic module identified by callout "2" in FIG. 1;

FIG. 3 is a top perspective view of a photovoltaic module assembly according to one embodiment of the present disclosure, the photovoltaic module assembly including the photovoltaic module depicted in FIGS. 1 and 2;

DETAILED DESCRIPTION OF THE EMBODIMENTS

Figure 4:
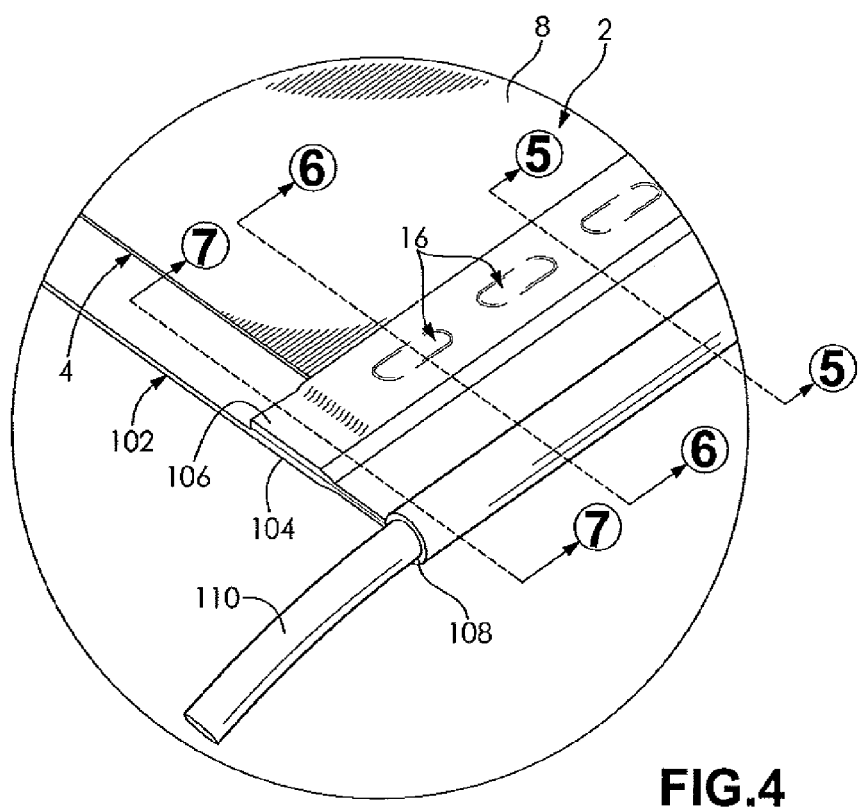
FIG. 4 is an enlarged fragmentary top perspective view of the photovoltaic module assembly identified by callout "4" in FIG. 3.

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

FIG. 1 shows a photovoltaic module 2 according to the present disclosure. The photovoltaic module 2 may include a number of unit cells (not shown) which are arranged in the photovoltaic module 2 for production of a DC power output. The photovoltaic module 2 may have the unit cells arranged in bidirectional arrays on an underlying plastic film substrate (not shown). Opposing ends 4, 6 of the photovoltaic module 2 may also include wire leads (not shown) through which the DC power output of the photovoltaic module 2 can be harvested.

In certain embodiments, the photovoltaic module 2 is a flexible thin film photovoltaic module including, as nonlimiting examples, one of amorphous silicon (a-Si), crystalline silicon, copper indium gallium selenide (CIGS), cadmium telluride (CdTe), and organic polymer. One of ordinary skill in the art may select suitable types of photovoltaic modules 2 having different configurations of unit cells and lead wires, and relying on different photovoltaic materials, as desired.

The photovoltaic module 2 has a main body 8, at least one peripheral edge strip 10, a top side 12, and a bottom side 14. The peripheral edge strip 10 is disposed adjacent the main body 8 of the photovoltaic module 2. In particular embodiments, the peripheral edge strip 10 is integral with the main body 8 of the photovoltaic module 2. In contrast to the main body 8, which can be considered a "functional" area due to the presence of the unit cells, the peripheral edge strip 10 is considered a "non-functional" area because the peripheral edge strip 10 does not include the unit cells and does not function to produce a power output of the photovoltaic module 2.

The non-functional peripheral edge strip 10 includes a plurality of windows or apertures 16. The apertures 16 are formed through the peripheral edge strip 16. The apertures 16 may be substantially evenly spaced along a length of the peripheral edge strip 10. As shown in FIG. 2, the apertures 16 may be substantially oval-shaped. A skilled artisan may use other spacing and shapes for the apertures 16, as desired.

It should be understood that the apertures 16 in the peripheral edge strip 10 of the photovoltaic module 2 may be preformed, or may be formed by other means prior to assembly of a photovoltaic module assembly 100 (shown in FIGS. 3-7). Various types of die presses and tooling can be used to form the apertures 16. As a nonlimiting example, a die cutting press may be used to form the apertures 16. As another nonlimiting example, the apertures 16 may be formed in the peripheral edge strip 10 of the photovoltaic module 2 using rotary die tooling that continuously cuts the apertures 16 into the photovoltaic module 2. Other means for forming the apertures 16 in the photovoltaic module 2 may also be used within the scope of the disclosure.

With reference to FIGS. 3-7, the photovoltaic module 2 is incorporated into the photovoltaic module assembly 100 for use in an architectural structure (not shown). The photovoltaic module assembly 100 includes the photovoltaic module 2 and a base layer 102. The base layer 102 is disposed adjacent the bottom side 14 of the photovoltaic module 2. The base layer 102 may be a single, unbroken or continuous piece, or may be formed from a plurality of separate pieces and subsequently joined, as desired. As nonlimiting examples, the base layer 102 may be formed from one of a fabric and a polymeric membrane. In certain embodiments, where the base layer 102 is formed from the fabric, the fabric may be one of woven and non-woven. In particular embodiments, the base layer 102 may be coated with a substantially water impermeable and weather-resistant coating. One of ordinary skill in the art may select other suitable materials and coatings for the base layer 102, as desired.

The base layer 102 has an underlying portion 104 and a flap portion 106. The flap portion 106 is folded over the peripheral edge strip 10, and is thereby also disposed adjacent the top side 12 of the photovoltaic module 2. The flap portion 106 is attached to the underlying portion 104 of the base layer 102 through the plurality of apertures 16 in the peripheral edge strip 10. The flap portion 106 may be attached to the underlying portion 104 by at least one of heat welding, sonic welding, and radio frequency welding, as nonlimiting examples. In other examples, an adhesive or sealant may be used to attach the flap portion 106 to the underlying portion 104 through the apertures 16. Other mechanical means for attaching including, but not limited to, rivets and stitching, may alternatively be employed. The photovoltaic module 2 is thereby secured to the base layer 102 to form the photovoltaic module assembly 100 of the present disclosure.

In a particular embodiment, the folded flap portion 106 forms a pocket 108 in which a cable 110 may be disposed. The cable 110 may extend outwardly from the pocket 108 at the opposing ends 4, 6 of the photovoltaic module 2, for example. As used herein, the term "cable" may include, but is not limited to, a solid core rod, steel aircraft cables, PVC extruded cords, wooden dowels, and ropes. The cable 110 may be employed to hold the photovoltaic module assembly 100 in a desired position, for example, as part of the overall architectural structure. A skilled artisan may select suitable materials for the cable 110, as desired.

The folded flap portion 106 may also attach to the underlying portion 104 of the base layer 102 between the peripheral edge strip 10 of the photovoltaic module 2 and the pocket 108. As with the attaching of the underlying portion 104 and the folded flap portion 106 of the base layer 102 through the apertures 16, the flap portion 106 may also be attached to the underlying portion 104 between the peripheral edge strip 10 of the photovoltaic module 2 and the pocket 108 by at least one of heat welding, sonic welding, and radio frequency welding, an adhesive or sealant, and by other mechanical means for attaching including, but not limited to, rivets and stitching.

Figure 5:
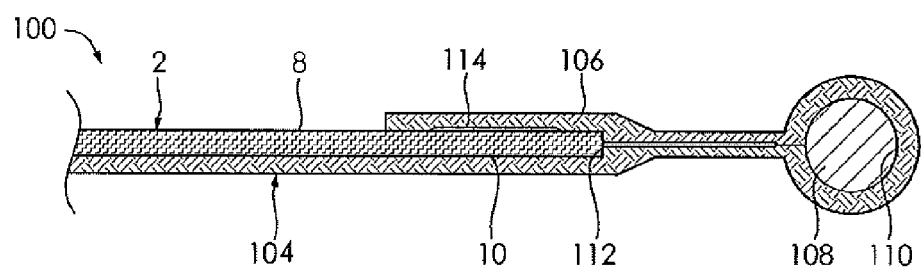
FIG. 5 is an enlarged fragmentary side cross-sectional elevational view of the photovoltaic module assembly take along section line 5-5 in FIG. 4.
Figure 6:
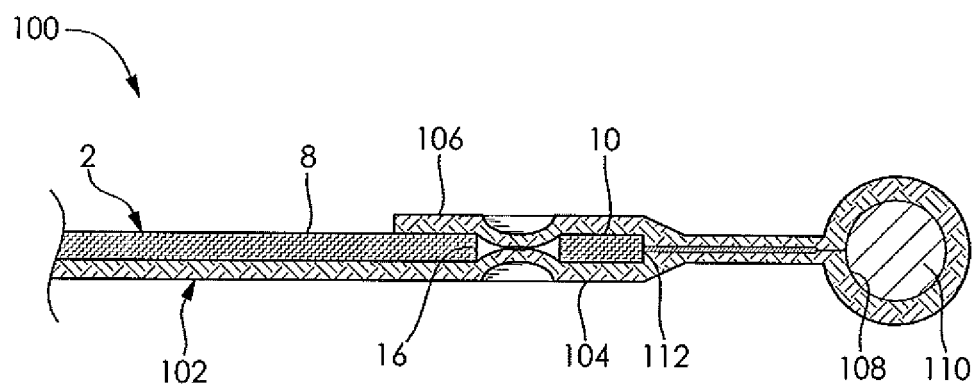
FIG. 6 is an enlarged fragmentary side cross-sectional elevational view of the photovoltaic module assembly take along section line 6-6 in FIG. 4.
Figure 7:
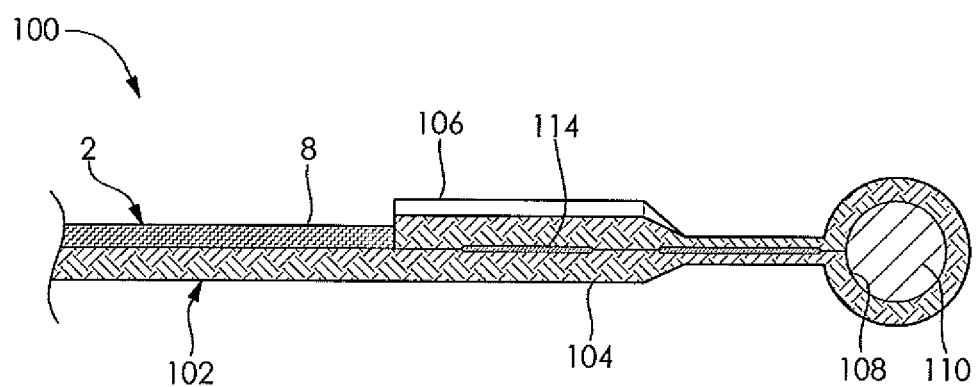
FIG. 7 is an enlarged fragmentary side cross-sectional elevational view of the photovoltaic module assembly take along section line 7-7 in FIG. 4.

It should be appreciated that the attaching of the folded flap portion 106 to the underlying portion 104 of the base layer 102 between the peripheral edge strip 10 of the photovoltaic module 2 and the pocket 108 may secure the cable 110 within the pocket 108, for example, as illustrated in FIGS. 5-7.

As shown in FIGS. 5-6, the attaching of the folded flap portion 106 to the underlying portion 104 of the base layer 102, between the peripheral edge strip 10 of the photovoltaic module 2 and the pocket 108, may also form a cradle 112 for receiving the peripheral edge strip 10 of the photovoltaic module 2.

At least one sealant 114 may also be employed in the photovoltaic module assembly 100 in order to militate against moisture entering between the photovoltaic module 2 and the base layer 102. For example, as shown in FIG. 5, the sealant 114 may be disposed between the folded flap portion 106 of the base layer 102 and the top surface 12 of the photovoltaic module 2 at the peripheral edge strip 10 where the apertures 16 are not formed. As another example, shown in FIG. 7, the sealant may be disposed between the folded flap portion 106 of the base layer 102 and the underlying portion 104 of the base layer 102 adjacent one of the ends 4, 6 of the photovoltaic module 2. Other suitable locations for the sealant 114 may also be selected, as desired.

The present disclosure includes a method for manufacturing the photovoltaic module assembly 100. The method includes the step of disposing the base layer 102 adjacent the bottom side 14 of the photovoltaic module 2. The flap portion 106 is then folded over the peripheral edge strip 10 of the photovoltaic module 2. The flap portion 106 is attached to the underlying portion 104 of the base layer 102 through the plurality of apertures 16 in the peripheral edge strip 10 of the photovoltaic module 2. The photovoltaic module 2 is thereby secured to the base layer 102 and forms the photovoltaic module 100 for use in the architectural structure.

Advantageously, the photovoltaic module 2 and photovoltaic module assembly 100 of the present disclosure can be incorporated into, or used as, various architectural structures. Examples include, but are not limited to, frames, clearspans, inflatable tension structures, outdoor shade structures, shades, awnings, canopies, banners, billboards and other signage, tents, tarps, swimming pool covers, sails, flat roofs, flat roof membranes, and other types of structures that are made from fabrics, including wing and stabilizer surfaces of ultra light and other aircraft. Additionally, the photovoltaic module 2 and photovoltaic module assembly 100 can be incorporated into curtains, draperies, window shades, umbrellas, backpacks, and articles of clothing. One of ordinary skill in the art may select alternative uses of the photovoltaic module 2 and photovoltaic module assembly 100, as desired.

While certain representative embodiments and details have been shown for purposes of illustrating the invention, it will be apparent to those skilled in the art that various changes may be made without departing from the scope of the invention, which is further described in the following appended claims.

What is claimed is:

1. A photovoltaic module assembly, comprising:
   a photovoltaic module having a bottom side, a top side, a main body, and a peripheral edge strip, the peripheral edge strip including a plurality of apertures pre-formed therethrough, the plurality of apertures disposed laterally inwardly from a perimeter edge of the peripheral edge strip; and
   a base layer disposed adjacent the bottom side of the photovoltaic module, the base layer having an underlying portion and a flap portion, the flap portion folded over the peripheral edge strip and disposed adjacent the top side of the photovoltaic module, the flap portion attached to the underlying portion of the base layer through the plurality of apertures in the peripheral edge strip, whereby the photovoltaic module is secured to the base layer;
   wherein the flap portion forms a pocket disposed laterally outwardly from the perimeter edge of the peripheral edge strip, the pocket containing one of a cord and a cable,
   wherein the flap portion is also attached to the underlying portion between the perimeter edge of the peripheral edge strip and the pocket,
   wherein the flap portion of the base layer abuts the underlying portion of the base layer in each of the plurality of apertures pre-formed in the peripheral edge strip of the photovoltaic module, and
   wherein an entirety of the one of the cord and the cable contained by the pocket is disposed laterally outwardly and spaced apart from the perimeter edge of the peripheral edge strip.

2. The photovoltaic module assembly of claim 1, wherein the one of the cord and the cable extends outwardly from the pocket at opposing ends of the photovoltaic module.

3. The photovoltaic module assembly of claim 1, wherein attaching of the flap portion to the underlying portion of the base layer between the peripheral edge strip of the photovoltaic module and the pocket forms a cradle between the flap portion and the underlying portion for receiving the peripheral edge strip of the photovoltaic module.

4. The photovoltaic module assembly of claim 1, wherein at least one of attaching of the flap portion to the underlying portion of the base layer through the plurality of apertures, and attaching of the flap portion to the underlying portion of the base layer between the peripheral edge strip of the photovoltaic module and the pocket, is performed by at least one of heat welding, sonic welding, radio frequency welding, stitching, and riveting.

5. The photovoltaic module assembly of claim 1, wherein the base layer is formed from one of a fabric and a polymeric membrane.

6. The photovoltaic module assembly of claim 5, wherein the base layer is formed from the fabric, and the fabric is one of woven and non-woven.

7. The photovoltaic module assembly of claim 1, wherein the base layer is coated with a substantially water impermeable and weather-resistant coating.

8. The photovoltaic module assembly of claim 1, wherein the photovoltaic module is a flexible thin film photovoltaic module.

9. The photovoltaic module assembly of claim 8, wherein the flexible thin film photovoltaic module includes one of amorphous silicon (a-Si), crystalline silicon, copper indium gallium selenide (CIGS), cadmium telluride (CdTe), and organic polymer.

10. The photovoltaic module assembly of claim 1, further including a sealant disposed at least one of between the flap portion of the base layer and the top side of the photovoltaic module at the peripheral edge strip where the plurality of apertures are not formed and between the flap portion of the base layer and the underlying portion of the base layer adjacent a longitudinal end of the peripheral edge strip.

11. The photovoltaic module assembly of claim 1, wherein each of the plurality of apertures pre-formed in the peripheral edge strip has an elongate shape orientated along a longitudinal direction of the peripheral edge strip.

12. The photovoltaic module assembly of claim 1, wherein a distance between adjacent pairs of the plurality of apertures is less than a longitudinal length of each of the plurality of apertures.

13. An architectural structure, comprising:
   a photovoltaic module assembly including a photovoltaic module having a bottom side, a top side, a main body, and a peripheral edge strip, the peripheral edge strip including a plurality of apertures pre-formed therethrough, the plurality of apertures disposed laterally inwardly from a perimeter edge of the peripheral edge strip, and a base layer disposed adjacent the bottom side of the photovoltaic module, the base layer having an underlying portion and a flap portion, the flap portion folded over the peripheral edge strip and disposed adjacent the top side of the photovoltaic module, the flap portion attached to the underlying portion of the base layer through the plurality of apertures in the peripheral edge strip, whereby the photovoltaic module is secured to the base layer;
   wherein the flap portion forms a pocket disposed laterally outwardly from the perimeter edge of the peripheral edge strip, the pocket containing one of a cord and a cable,
   wherein the flap portion is also attached to the underlying portion between the perimeter edge of the peripheral edge strip and the pocket, wherein the flap portion of the base layer abuts the underlying portion of the base layer in each of the plurality of apertures pre-formed in the peripheral edge strip of the photovoltaic module, and wherein an entirety of the one of the cord and the cable contained by the pocket is disposed laterally outwardly and spaced apart from the perimeter edge of the peripheral edge strip.

14. A method for manufacturing a photovoltaic module assembly, the method comprising the steps of:

providing a photovoltaic module having a bottom side, a top side, a main body, and a peripheral edge strip, the peripheral edge strip including a plurality of apertures pre-formed therethrough, the plurality of apertures disposed laterally inwardly from a perimeter edge of the peripheral edge strip, and a base layer having an underlying portion and a flap portion;

disposing the base layer adjacent the bottom side of the photovoltaic module;

folding the flap portion over the peripheral edge strip of the photovoltaic module; and attaching the flap portion to the underlying portion of the base layer through the plurality of pre-formed apertures in the peripheral edge strip of the photovoltaic module, whereby the photovoltaic module is secured to the base layer, wherein the flap portion forms a pocket disposed laterally outwardly from the perimeter edge of the peripheral edge strip;

attaching the flap portion to the underlying portion of the base layer between the perimeter edge of the peripheral edge strip and the pocket, wherein the flap portion of the base layer abuts the underlying portion of the base layer in each of the plurality of apertures pre-formed in the peripheral edge strip of the photovoltaic module; and disposing one of a cord and a cable within the pocket, wherein an entirety of the one of the cord and the cable contained by the pocket is disposed laterally outwardly and spaced apart from the perimeter edge of the peripheral edge strip.

15. The method of claim 14, wherein the attaching of the flap portion to the underlying portion of the base layer between the peripheral edge strip of the photovoltaic module and the pocket forms a cradle for receiving the peripheral edge strip of the photovoltaic module, the method including a step of disposing the peripheral edge strip of the photovoltaic module in the cradle.

16. The method of claim 14, wherein at least one of the attaching of the flap portion to the underlying portion of the base layer through the plurality of apertures and the attaching of the flap portion to the underlying portion of the base layer between the peripheral edge strip of the photovoltaic module and the pocket is performed by at least one of heat welding, sonic welding, and radio frequency welding.

17. The method of claim 14, further comprising a step of pre-forming the plurality of apertures in the peripheral edge strip of the photovoltaic module prior to the step of attaching the flap portion to the underlying portion of the base layer through the plurality of apertures in the peripheral edge strip of the photovoltaic module.

18. The method of claim 14, further comprising a step of disposing a sealant between the flap portion of the base layer and the top surface of the photovoltaic module at the peripheral edge strip where the plurality of aperture are not formed, the sealant militating against moisture entering between the photovoltaic module and the base layer.

19. The method of claim 14, further comprising a step of disposing a sealant between the flap portion of the base layer and the underlying portion of the base layer adjacent an end of the photovoltaic module, the sealant militating against moisture entering between the photovoltaic module and the base layer.

* * * * *